US011955203B2

(12) United States Patent
Yang et al.

(10) Patent No.: US 11,955,203 B2
(45) Date of Patent: Apr. 9, 2024

(54) TECHNIQUES TO MITIGATE MEMORY DIE MISALIGNMENT

(71) Applicant: Micron Technology, Inc., Boise, ID (US)

(72) Inventors: Jie Yang, Shanghai (CN); Xu Zhang, Shanghai (CN); Bin Zhao, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 227 days.

(21) Appl. No.: 17/629,600

(22) PCT Filed: Mar. 18, 2021

(86) PCT No.: PCT/CN2021/081480
§ 371 (c)(1),
(2) Date: Jan. 24, 2022

(87) PCT Pub. No.: WO2022/193218
PCT Pub. Date: Sep. 22, 2022

(65) Prior Publication Data
US 2023/0360682 A1    Nov. 9, 2023

(51) Int. Cl.
*G11C 7/10*    (2006.01)
*G11C 7/14*    (2006.01)

(52) U.S. Cl.
CPC .......... *G11C 7/1084* (2013.01); *G11C 7/1069* (2013.01); *G11C 7/1096* (2013.01); *G11C 7/14* (2013.01)

(58) Field of Classification Search
None
See application file for complete search history.

(56) References Cited

U.S. PATENT DOCUMENTS

| 8,996,796 | B1 | 3/2015 | Karamcheti et al. | |
| 9,355,022 | B2* | 5/2016 | Ravimohan | G06F 3/0679 |
| 9,417,802 | B1 | 8/2016 | Berke et al. | |
| 2019/0163620 | A1* | 5/2019 | Muthiah | G06F 9/3013 |
| 2020/0073804 | A1 | 3/2020 | Moon et al. | |

OTHER PUBLICATIONS

ISA/CN, "International Search Report and Written Opinion of the International Searching Authority" issued in connection with Int'l Appl. No. PCT/CN2021/081480, dated Dec. 17, 2021 (8 pgs).

* cited by examiner

*Primary Examiner* — Kretelia Graham
(74) *Attorney, Agent, or Firm* — Holland & Hart LLP

(57) ABSTRACT

Methods, systems, and devices for mitigating memory die misalignment are described. A memory system may receive a command to write data to a memory device including a memory die. The memory system may determine whether the data indicated by the command (e.g., a first set of data) satisfies a threshold size. If the first set of data satisfies the threshold size, the memory system may determine whether data currently in a write buffer aligns with a boundary of the memory die. For example, depending on the data currently in the buffer, adding the first set of data to the buffer may result in die misalignment for the first set of data. To mitigate die misalignment, the memory system may pad data (e.g., add dummy data) to the write buffer, such that the padding aligns the data with the die boundary.

24 Claims, 6 Drawing Sheets

TECHNIQUES TO MITIGATE MEMORY DIE MISALIGNMENT

CROSS REFERENCE

The present Application for Patent is a 371 national phase filing of International Patent Application No. PCT/CN2021/081480 by Yang et al., entitled "TECHNIQUES TO MITIGATE MEMORY DIE MISALIGNMENT," filed Mar. 18, 2021, assigned to the assignee hereof, and expressly incorporated by reference herein.

FIELD OF TECHNOLOGY

The following relates generally to one or more systems for memory and more specifically to techniques to mitigate memory die misalignment.

BACKGROUND

Memory devices are widely used to store information in various electronic devices such as computers, user devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
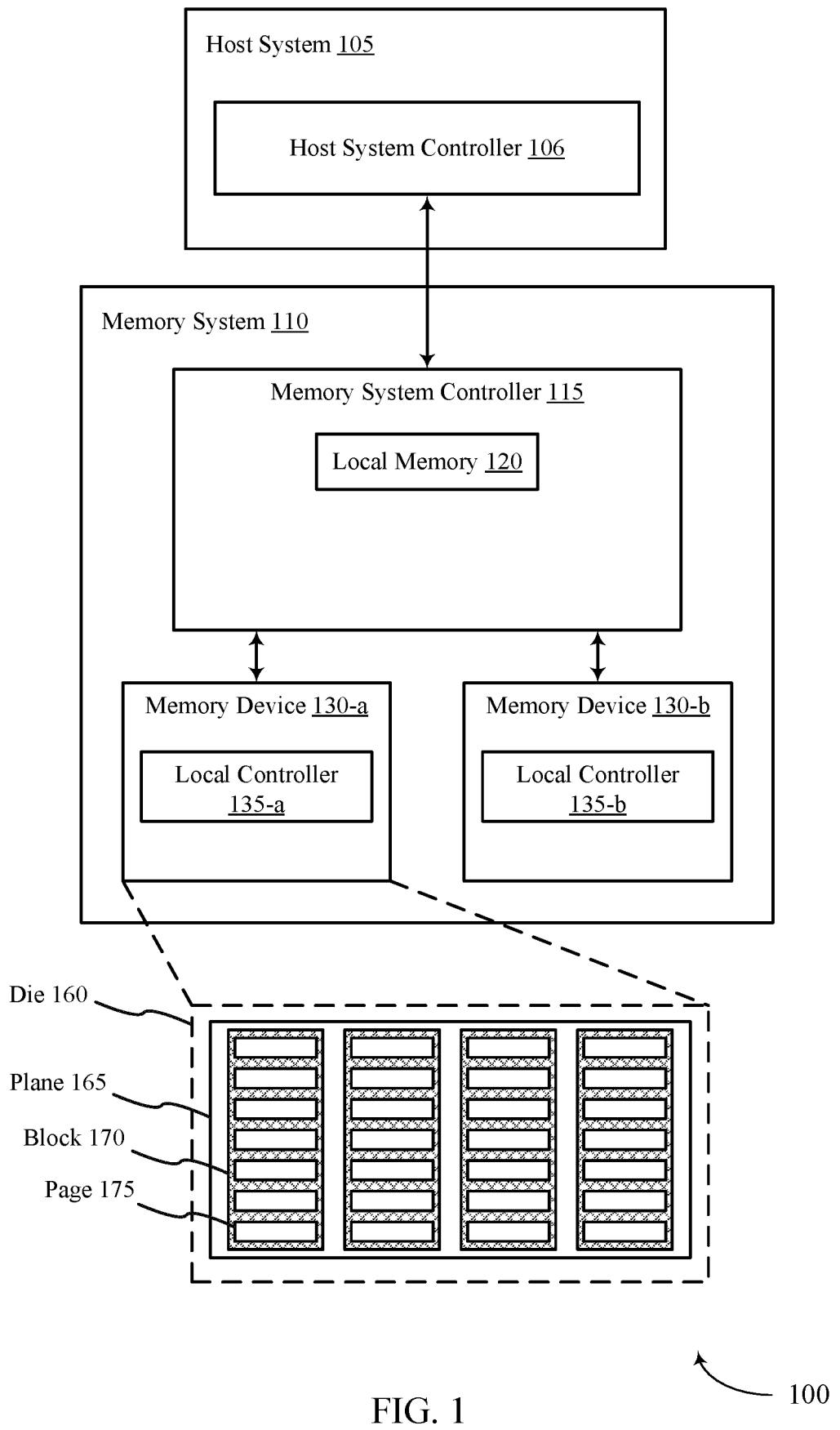
FIGS. 1 through 3 illustrate examples of systems that support techniques to mitigate memory die misalignment in accordance with examples as disclosed herein.

Some memory devices, such as not-and (NAND) memory devices, solid-state drives (SSDs), or other memory devices, may store data starting at a specific offset within a memory die. The offset for a memory die may correspond to a specific plane, block, page, or some combination thereof for the memory die, where an offset of zero corresponds to a boundary (e.g., a start boundary) of the memory die. A memory system may efficiently read data written to a memory device starting at an offset of zero. For example, if data is written to a memory die with a start logical block address (LBA) at an offset of zero, the configuration may be referred to as "die alignment" or being "die aligned." In such a configuration, the memory system may perform a sequential read operation to read the data starting from the offset of zero and may leverage a cache read operation to further improve the read performance. However, if data is written to the memory die with a start LBA at an offset other than zero, the configuration may be referred to as "die misalignment" or being "die misaligned." In such a configuration, the memory system may perform multiple read operations to read the data from the correct start LBA and may not support cache read operations. As such, as compared to a die-alignment configuration, a die-misalignment configuration may result in inefficient read operations due to increased read latency and processing overhead, among other disadvantages. Furthermore, the negative effects of die misalignment may be especially significant for read operations performed on relatively large data files (e.g., data files spanning multiple multi-plane pages of a memory die) due to the relatively large quantity of read operations performed for reading relatively large data files across multiple multi-plane pages.

To support techniques to mitigate memory die misalignment, a memory system may implement techniques for padding data in a write buffer. For example, the memory system may receive a command (e.g., an access command, such as a write command) to write data to a memory device including a memory die. The memory system may determine whether the data indicated by the command (e.g., a first set of data) satisfies a threshold size (e.g., a threshold size corresponding to a relatively large chunk write command). If the first set of data satisfies the threshold size, the memory system may determine whether data currently in a write buffer aligns with a boundary of the memory die of the memory device. For example, if the memory system previously added data to the write buffer corresponding to a relatively small write command (e.g., an internal write command), adding the first set of data to the buffer may result in die misalignment for the first set of data. To mitigate die misalignment, the memory system may determine a quantity of data to add to the write buffer (e.g., padding the data currently in the write buffer with dummy data). Padding the data may result in the data stored in the write buffer aligning with a boundary of the memory die. The memory system may add the first set of data to the write buffer following the data padding such that, if the first set of data is written from the write buffer to the memory die, the start of the first set of data aligns with the boundary of the memory die. Accordingly, the memory system may mitigate die misalignment and support improved read performance (e.g., compared to die misaligned data) for data satisfying the threshold size.

Figure 2:
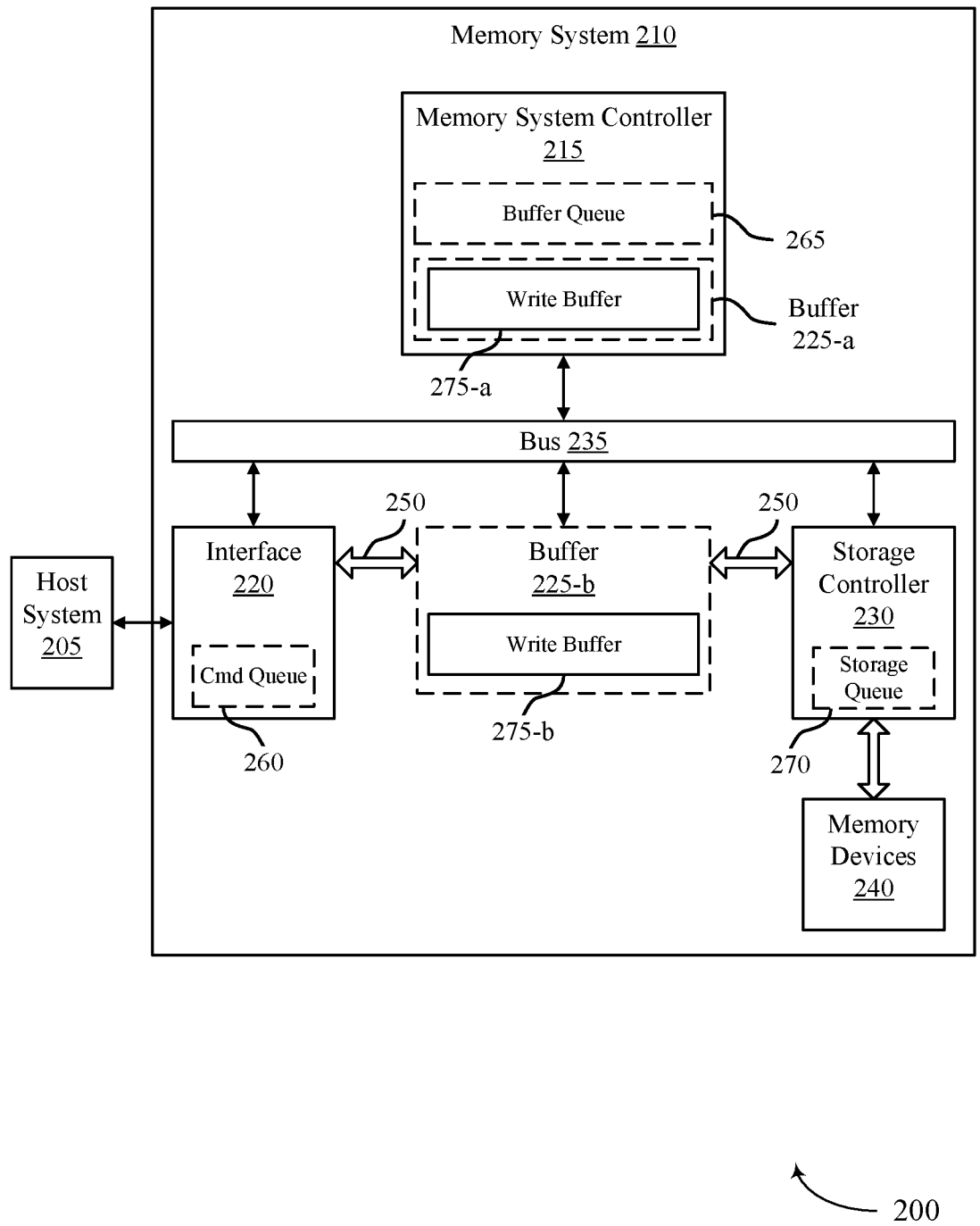
Figure 3:
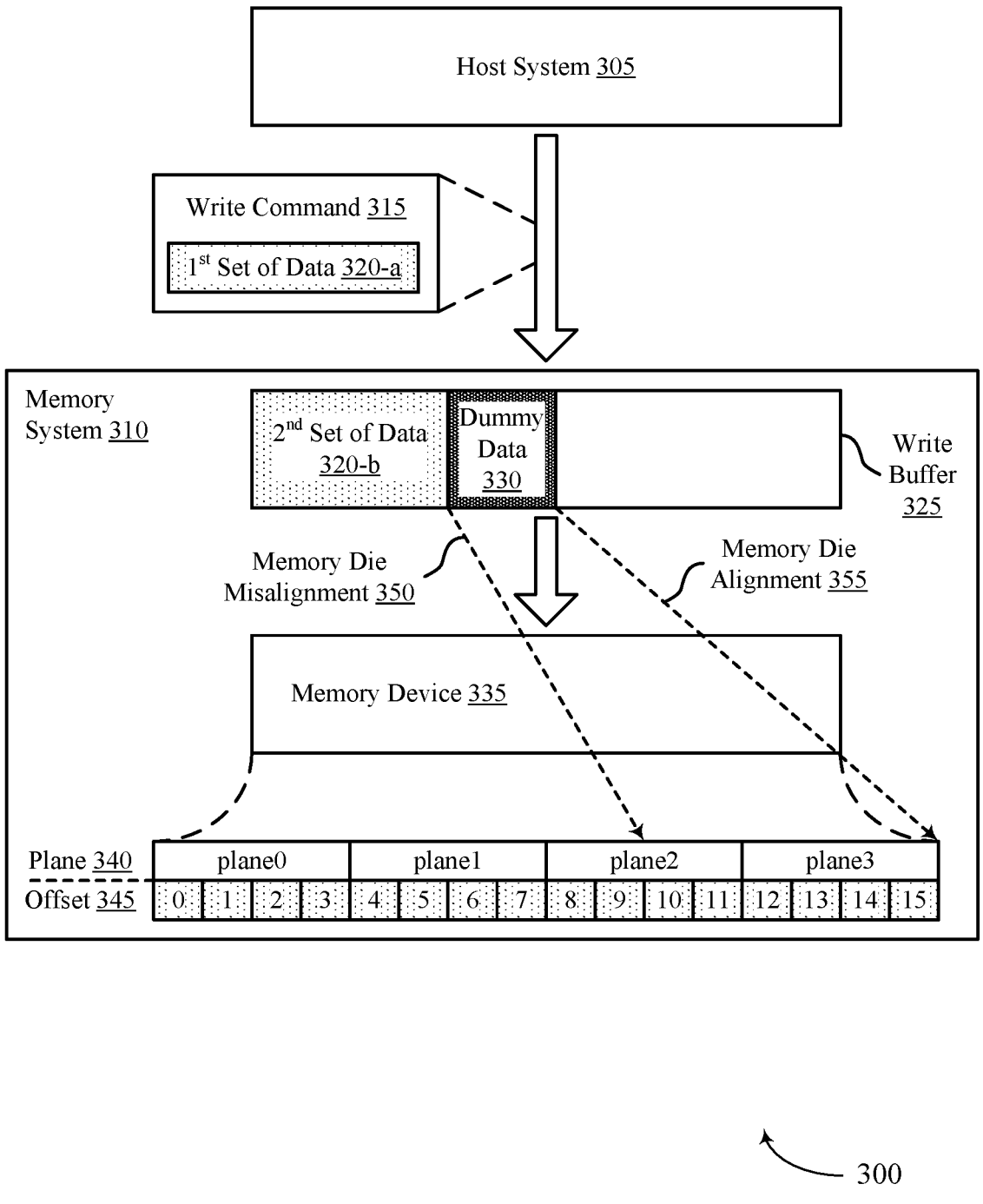

Features of the disclosure are initially described in the context of systems and devices with reference to FIGS. 1 through 3. Additional features of the disclosure are described in the context of a process flow with reference to FIG. 4. These and other features of the disclosure are further illustrated by and described in the context of an apparatus diagram and a flowchart that relate to techniques to mitigate memory die misalignment with reference to FIGS. 5 and 6.

FIG. 1 illustrates an example of a system 100 that supports techniques to mitigate memory die misalignment in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, an SSD, a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., LBAs) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, performing concurrent operations in different planes 165 may be subject to one or more restrictions, such as identical operations being performed on memory cells within different pages 175 that have the same page address within their respective planes 165 (e.g., related to command decoding, page address decoding circuitry, or other circuitry being shared across planes 165).

For example, the host system 105 may read data from and write data to a page 175 across multiple planes 165 of a memory die 160. The page 175 across the multiple planes 165, which may be referred to as a multi-plane page, may include multiple offsets at which data may be written and read. Each offset may correspond to a smallest unit of data supported by the memory device 130. For example, the host system 105 may support a lower limit of a data size (e.g., a minimum data size) for reading and writing data (e.g., 4 kB for universal flash storage (UFS), 512 bytes (B) for embedded multiMediaCard (eMMC)). A multi-plane page of the memory device 130 may be divided into multiple offsets of the lower limit of the data size, such that data may be written to the multi-plane page starting at any offset and, correspondingly, may be read from the multi-plane page starting at any offset.

In some examples, a memory device 130 (e.g., a NAND flash device) may include a physical page size of 16 kB. The memory device 130 may support parallel read and write operations across different planes 165 of a memory die 160 (e.g., two or four planes). Accordingly, the multi-plane page size of the memory device 130 may be 32 kB for a two-plane NAND die 160 or 64 kB for a four-plane NAND die 160. However, other page sizes and quantities of planes may be supported by the system 100. If the lower limit of the data read and write size is 4 kB, and the multi-plane physical page size is 64 kB, the multi-plane page may include 16 units for reading and writing data of the lower limit of the size (e.g., each unit is one user data size of 4 kB). Accordingly, the multi-plane page may support 16 possible offsets. If the host system 105 writes data to a multi-plane page of a memory die 160 starting at offset zero, the write operation may result in die alignment. However, if the host system 105 writes data to a multi-plane page of the memory die 160 starting at an offset other than zero (e.g., one through fifteen), the write operation may result in die misalignment. The system 100 may support one or more techniques to avoid die misalignment. For example, the system 100 may support write buffer padding (e.g., with dummy data) to mitigate memory die misalignment.

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programmed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

The system 100 may include any quantity of non-transitory computer readable media that support techniques to mitigate memory die misalignment. For example, the host system 105, the memory system controller 115, or a memory device 130 may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

Although the features of the disclosure are described herein with reference to NAND memory devices 130, the features of the disclosure may be implemented with other memory devices 130 or memory systems 110 that implement different memory technologies. For example, one or more features of the disclosure described herein may be implemented in non-volatile memory or other memory devices 130, such as an SSD memory device, a DRAM memory device, a FeRAM memory device, or others.

FIG. 2 illustrates an example of a system 200 that supports techniques to mitigate memory die misalignment in accordance with examples as disclosed herein. The system 200 may be an example of a system 100 as described with reference to FIG. 1 or aspects thereof. The system 200 may include a memory system 210 configured to store data received from the host system 205 and to send data to the host system 205, if requested by the host system 205 using access commands (e.g., read commands or write commands). The system 200 may implement aspects of the system 100 as described with reference to FIG. 1. For example, the memory system 210 and the host system 205 may be examples of the memory system 110 and the host system 105, respectively.

The memory system 210 may include memory devices 240 to store data transferred between the memory system 210 and the host system 205, e.g., in response to receiving access commands from the host system 205, as described herein. The memory devices 240 may include one or more memory devices as described with reference to FIG. 1. For example, the memory devices 240 may include NAND memory, PCM, self-selecting memory, 3D cross point, other chalcogenide-based memories, FERAM, MRAM, NOR (e.g., NOR flash) memory, STT-MRAM, CBRAM, RRAM, or OxRAM.

The memory system 210 may include a storage controller 230 for controlling the passing of data directly to and from the memory devices 240, e.g., for storing data, retrieving data, and determining memory locations in which to store data and from which to retrieve data. The storage controller 230 may communicate with memory devices 240 directly or via a bus (not shown) using a protocol specific to each type of memory device 240. In some cases, a single storage controller 230 may be used to control multiple memory devices 240 of the same or different types. In some cases, the memory system 210 may include multiple storage controllers 230, e.g., a different storage controller 230 for each type of memory device 240. In some cases, a storage controller 230 may implement aspects of a local controller 135 as described with reference to FIG. 1.

The memory system 210 may additionally include an interface 220 for communication with the host system 205 and a buffer 225 for temporary storage of data being transferred between the host system 205 and the memory devices 240. In some examples, the interface 220, buffer 225, and storage controller 230 may be for translating data between the host system 205 and the memory devices 240, e.g., as shown by a data path 250, and may be collectively referred to as data path components. In some systems (e.g., for managed NAND), a buffer 225-*a* may be a component of a memory system controller 215. In some other systems (e.g., for SSD), a buffer 225-*b* may be separate from the memory system controller 215.

Using the buffer 225 to temporarily store data during transfers may allow data to be buffered as commands are being processed, thereby reducing latency between commands and allowing arbitrary data sizes associated with commands. This may also allow bursts of commands to be handled, and the buffered data may be stored or transmitted (or both) once a burst has stopped. The buffer 225 may include relatively fast memory (e.g., some types of volatile memory, such as SRAM or DRAM) or hardware accelerators or both to allow fast storage and retrieval of data to and from the buffer 225. The buffer 225 may include data path switching components for bi-directional data transfer between the buffer 225 and other components.

In some cases, the temporary storage of data within a buffer 225 may refer to the storage of data in the buffer 225 during the execution of access commands. That is, upon completion of an access command, the associated data may no longer be maintained in the buffer 225 (e.g., may be overwritten with data for additional access commands). In addition, the buffer 225 may be a non-cache buffer. That is, data may not be read directly from the buffer 225 by the host system 205. For example, read commands may be added to a queue without an operation to match the address to addresses already in the buffer 225 (e.g., without a cache address match or lookup operation).

The memory system 210 may additionally include a memory system controller 215 for executing the commands received from the host system 205 and controlling the data path components in the moving of the data. The memory system controller 215 may be an example of the memory system controller 115 as described with reference to FIG. 1. A bus 235 may be used to communicate between the system components. In some examples, the memory system controller 215 may be an example of a processor associated with an ASIC. For example, the system 200 may include multiple memory dies. A first memory die (e.g., an ASIC controller die) may include the interface 220, the buffer 225-*b*, the storage controller 230, or a combination thereof and may be controlled by the memory system controller 215. In some cases, the first memory die may additionally include the memory system controller 215. A second memory die may include one or more memory devices 240 and may include a local controller (not shown). The memory dies may communicate with each other using the bus 235.

In some cases, one or more queues (e.g., a command queue 260, a buffer queue 265, and a storage queue 270) may be used to control the processing of the access commands and the movement of the corresponding data. This may be beneficial, e.g., if more than one access command from the host system 205 is processed concurrently by the memory system 210. The command queue 260, buffer queue 265, and storage queue 270 are depicted at the interface 220, memory system controller 215, and storage controller 230, respectively, as examples of a possible implementation. However, queues, if used, may be positioned anywhere within the memory system 210.

Data transferred between the host system 205 and the memory devices 240 may take a different path in the memory system 210 than non-data information (e.g., commands, status information). For example, the system components in the memory system 210 may communicate with each other using a bus 235, while the data may use the data path 250 through the data path components instead of the bus 235. The memory system controller 215 may control how and if data is transferred between the host system 205 and the memory devices 240 by communicating with the data path components over the bus 235 (e.g., using a protocol specific to the memory system 210).

If a host system 205 transmits access commands to the memory system 210, the commands may be received by the interface 220, e.g., according to a protocol (e.g., a UFS protocol or an eMMC protocol). Thus, the interface 220 may be considered a front end of the memory system 210. Upon receipt of each access command, the interface 220 may communicate the command to the memory system controller 215, e.g., via the bus 235. In some cases, each command may be added to a command queue 260 by the interface 220 to communicate the command to the memory system controller 215.

The memory system controller 215 may determine that an access command has been received in response to the communication from the interface 220. In some cases, the memory system controller 215 may determine the access command has been received by retrieving the command from the command queue 260. The command may be removed from the command queue 260 after it has been retrieved therefrom, e.g., by the memory system controller 215. In some cases, the memory system controller 215 may cause the interface 220, e.g., via the bus 235, to remove the command from the command queue 260.

Upon the determination that an access command has been received, the memory system controller 215 may execute the access command. For a read command, this may mean obtaining data from the memory devices 240 and transmitting the data to the host system 205. For a write command, this may mean receiving data from the host system 205 and moving the data to the memory devices 240.

In either case, the memory system controller 215 may use a buffer 225 for, among other things, temporary storage of the data being received from or sent to the host system 205. The buffer 225-a or the buffer 225-b may be considered a middle end of the memory system 210. In some cases, buffer address management (e.g., pointers to address locations in the buffer 225) may be performed by hardware (e.g., dedicated circuits) in the interface 220, buffer 225, or storage controller 230.

To process a write command received from the host system 205, the memory system controller 215 may first determine if a buffer 225 has sufficient available space to store the data associated with the command. For example, the memory system controller 215 may determine, e.g., via firmware (e.g., controller firmware), an amount of space within the buffer 225 that may be available to store data associated with the write command.

In some cases, a buffer queue 265 may be used to control a flow of commands associated with data stored in the buffer 225, including write commands. The buffer queue 265 may include the access commands associated with data currently stored in the buffer 225. In some cases, the commands in the command queue 260 may be moved to the buffer queue 265 by the memory system controller 215 and may remain in the buffer queue 265 while the associated data is stored in the buffer 225. In some cases, each command in the buffer queue 265 may be associated with an address at the buffer 225. That is, pointers may be maintained that indicate where in the buffer 225 the data associated with each command is stored. Using the buffer queue 265, multiple access commands may be received sequentially from the host system 205 and at least portions of the access commands may be processed concurrently.

If the buffer 225 has sufficient space to store the write data, the memory system controller 215 may cause the interface 220 to transmit an indication of availability to the host system 205 (e.g., a "ready to transfer" indication), e.g., according to a protocol (e.g., a UFS protocol or an eMMC protocol). As the interface 220 subsequently receives from the host system 205 the data associated with the write command, the interface 220 may transfer the data to the buffer 225 for temporary storage using the data path 250. In some cases, the interface 220 may obtain from the buffer 225 or buffer queue 265 the location within the buffer 225 to store the data. The interface 220 may indicate to the memory system controller 215, e.g., via the bus 235, if the data transfer to the buffer 225 has been completed.

Once the write data has been stored in the buffer 225 by the interface 220, the data may be transferred out of the buffer 225 and stored in a memory device 240. This may be done using the storage controller 230. For example, the memory system controller 215 may cause the storage controller 230 to retrieve the data out of the buffer 225 using the data path 250 and transfer the data to a memory device 240. The storage controller 230 may be considered a back end of the memory system 210. The storage controller 230 may indicate to the memory system controller 215, e.g., via the bus 235, that the data transfer to a memory device of the memory devices 240 has been completed.

In some cases, a storage queue 270 may be used to aid with the transfer of write data. For example, the memory system controller 215 may push (e.g., via the bus 235) write commands from the buffer queue 265 to the storage queue 270 for processing. The storage queue 270 may include entries for each access command. In some examples, the storage queue 270 may additionally include a buffer pointer (e.g., an address) that may indicate where in the buffer 225 the data associated with the command is stored and a storage pointer (e.g., an address) that may indicate the location in the memory devices 240 associated with the data. In some cases, the storage controller 230 may obtain from the buffer 225, buffer queue 265, or storage queue 270 the location within the buffer 225 from which to obtain the data. The storage controller 230 may manage the locations within the memory devices 240 to store the data (e.g., performing wear-leveling, garbage collection, and the like). The entries may be added to the storage queue 270, e.g., by the memory system controller 215. The entries may be removed from the storage queue 270, e.g., by the storage controller 230 or memory system controller 215 upon completion of the transfer of the data.

To support access commands, such as write commands, the system 200 may implement data padding in a write buffer 275. For example, a buffer 225 may include—or be an example of—a write buffer 275. In some memory systems 210, a memory system controller 215 may include a buffer 225-a, such as a write buffer 275-a. Additionally or alternatively, the memory system 210 may include a buffer 225-b, such as a write buffer 275-b, external to the memory system controller 215. A write buffer 275 of the memory system 210 may store data after the data has been received from a host system 205 and prior to writing the data to a memory device 240. For example, the memory system 210 may receive an access command from the host system 205 to write a first set of data to a memory device 240. The memory system 210 may add the first set of data to a write buffer 275 (e.g., a write buffer 275-a or a write buffer 275-b). If a flush condition is met for the write buffer 275 (e.g., the data in the buffer satisfies a buffer size threshold, a flush command is received from the host system 205), the memory system 210 may write the data from the write buffer 275 to a memory device 240 and may remove the data from the write buffer 275.

The memory system 210 may write the data from the write buffer 275 to a specific resource of a memory device 240 according to an LBA cursor. For example, the memory system 210 may write data from the write buffer 275 to a memory device 240 starting at an LBA indicated by the LBA cursor. The LBA cursor may indicate a specific offset (e.g., a multi-plane page offset) within a memory die of the memory device 240. Data written to the memory die at a multi-plane page offset of zero may be aligned with a boundary of the memory die, while data written to the memory die at a non-zero multi-plane page offset may be misaligned with a boundary of the memory die. Accordingly, the memory system 210 may determine whether adding data for a write command to the write buffer 275 aligns the data with a boundary of a memory die. For example, using a current LBA cursor value and a current quantity of data in the write buffer 275, the memory system 210 may determine that adding the data to the write buffer 275 misaligns the data with a die boundary (e.g., if the data is written from the write buffer 275 to the memory die). The memory system 210 may add dummy data to the write buffer 275, such that adding the data to the write buffer 275 results in data alignment if the data is written from the write buffer 275 to the memory die.

To process a read command received from the host system 205, the memory system controller 215 may again first determine if the buffer 225 has sufficient available space to store the data associated with the command. For example, the memory system controller 215 may determine, e.g., via firmware (e.g., controller firmware), an amount of space within the buffer 225 that may be available to store data associated with the read command.

In some cases, the buffer queue 265 may be used to aid with buffer storage of data associated with read commands in a similar manner as discussed above with respect to write commands. For example, if the buffer 225 has sufficient space to store the read data, the memory system controller 215 may cause the storage controller 230 to retrieve the data associated with the read command from a memory device 240 and store the data in the buffer 225 for temporary storage using the data path 250. The storage controller 230 may indicate to the memory system controller 215, e.g., via the bus 235, that the data transfer to the buffer 225 has been completed.

If the data to retrieve from the memory device 240 is die aligned (e.g., is written starting at a die boundary of a memory die, such that the data fills a complete multi-plane page of the memory die), the memory system 210 may read data from the memory die using a sequential read operation for the multi-plane page. For example, the memory system 210 may read the data from the multi-plane page using a multi-plane read operation, involving a single media request (e.g., as opposed to using multiple media requests in order to read a subset of data stored in the multi-plane page if the data is written according to a die misaligned configuration). Using the multi-plane read operation, the sequential read operation, or both and, correspondingly, reducing a total quantity of read operations called to read a set of data from the memory die, may reduce the processing overhead and latency associated with reading data (e.g., data satisfying a size threshold) from a memory die of the memory device 240.

In some cases, the storage queue 270 may be used to aid with the transfer of read data. For example, the memory system controller 215 may push the read command to the storage queue 270 for processing. In some cases, the storage controller 230 may obtain from the buffer 225 or storage queue 270 the location within the memory devices 240 from which to retrieve the data. In some cases, the storage controller 230 may obtain from the buffer queue 265 the location within the buffer 225 to store the data. In some cases, the storage controller 230 may obtain from the storage queue 270 the location within the buffer 225 to store the data. In some cases, the memory system controller 215 may move the command processed by the storage queue 270 back to the command queue 260.

Once the data has been stored in the buffer 225 by the storage controller 230, the data may be transferred out of the buffer 225 and sent to the host system 205. For example, the memory system controller 215 may cause the interface 220 to retrieve the data out of the buffer 225 using the data path 250 and transmit the data to the host system 205, e.g., according to a protocol (e.g., a UFS protocol or an eMMC protocol). For example, the interface 220 may process the command from the command queue 260 and may indicate to the memory system controller 215, e.g., via the bus 235, that the data transmission to the host system 205 has been completed.

The memory system controller 215 may execute received commands according to an order (e.g., a first-in, first-out order, according to the order of the command queue 260). For each command, the memory system controller 215 may cause data corresponding to the command to be moved into and out of the buffer 225, as discussed above. As the data is moved into and stored within the buffer 225, the command may remain in the buffer queue 265. A command may be removed from the buffer queue 265, e.g., by the memory system controller 215, if the processing of the command has been completed (e.g., if data corresponding to the access command has been transferred out of the buffer 225). If a command is removed from the buffer queue 265, the address previously storing the data associated with that command may be available to store data associated with a new command.

The memory system controller 215 may additionally be configured for operations associated with the memory devices 240. For example, the memory system controller 215 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., LBAs) associated with commands from the host system 205 and physical addresses (e.g., physical block addresses) associated with memory cells within the memory devices 240. That is, the host system 205 may issue commands indicating one or more LBAs and the memory system controller 215 may identify one or more physical block addresses indicated by the LBAs. In some cases, one or more contiguous LBAs may correspond to noncontiguous physical block addresses. In some cases, the storage controller 230 may be configured to perform one or more of the above operations in conjunction with or instead of the memory system controller 215. In some cases, the memory system controller 215 may perform the functions of the storage controller 230 and the storage controller 230 may be omitted.

FIG. 3 illustrates an example of a system 300 that supports techniques to mitigate memory die misalignment in accordance with examples as disclosed herein. The system 300 may be an example of a system 100 or a system 200 as described with reference to FIGS. 1 and 2. The system 300 may include a host system 305 and a memory system 310, which may be examples of the corresponding systems described with reference to FIGS. 1 and 2. The memory system 310 may include a write buffer 325, which may be an example of a buffer 225 or a write buffer 275 as described with reference to FIG. 2. In some examples, the memory system 310 may implement one or more techniques to mitigate memory die misalignment (e.g., at a memory device 335).

The host system 305 may send an access command to the memory system 310. For example, the host system 305 may transmit a write command 315 indicating a first set of data 320-a to write to a memory device 335 of the memory system 310. In some cases, the memory device 335 may be an example of a NAND (e.g., NAND flash) memory device, an SSD, or any other memory device 335. The memory device 335 may be or include a memory die, which may include a quantity of pages, planes 340, or both. For example, the memory die may correspond to a set of physical partitions (e.g., planes, pages, cells, or some combination thereof) within the memory device 335, a set of logical partitions (e.g., LBAs) within the memory device 335, or both. A page of the memory die spanning multiple planes may be referred to as a multi-plane page.

A multi-plane page of the memory device 335 may include a set of planes 340 and multiple offsets 345. For example, as described with reference to FIG. 1, a multi-plane page may include four planes 340 (e.g., plane0, plane1, plane2, and plane3) and sixteen offsets 345 (e.g., 0 through 15). If a memory system 310 receives a read command on the memory device 335, the read command may indicate an initial LBA for reading data from the memory device 335. The initial LBA may correspond to an offset 345 in a multi-plane page (e.g., according to a logical-to-physical (L2P) mapping).

If the initial LBA maps to the offset 0 (e.g., corresponding to a boundary of the memory die and a die aligned configuration), the memory system 310 may efficiently read the data from the memory device 335. For example, due to the die alignment, the memory system 310 may perform a single read operation (e.g., a system level sequential read operation) to read the data from the memory device 335 and may leverage a cache read operation to further improve the read performance. For instance, the memory system 310 may load a first portion of a mapping of logical-to-physical addresses from permanent storage (e.g., NAND) to a cache (e.g., SRAM). If die alignment occurs, the memory system 310 may be configured to transfer fewer portions of the mapping between the NAND and the cache to complete the read operation, thereby reducing a latency for performing the operations. Based on or in response to reading data starting from the offset 0, the memory device 335 may support a relatively large chunk size (e.g., 512 kB) sequential and random read performance of approximately 2000 megabytes per second (MBps). Alternatively, if the initial LBA maps to an offset other than zero (e.g., any offset from 1 through 15), the read performance at the device level (e.g., memory device 335 level) and the system level (e.g., memory system 310 level) may decrease as compared to reading data starting from the offset of zero. For example, due to the die misalignment, the memory system 310 may perform two read operations to read the data from the memory device 335 starting from the correct offset and may not support leveraging a cache read operation (e.g., based on or in response to performing two read operations to read the data from the multi-plane page). Due to performing multiple read commands (e.g., fewer sequential read operations) and without leveraging a cache read operation, reading data with die misalignment may significantly increase processing overhead and processing latency as compared to reading data with die alignment. The memory device 335 may support a read performance of approximately 1000 MBps for die misalignment. This decrease in performance associated with die misalignment may be especially significant if reading a relatively large data file (e.g., above a threshold size) due to reading the relatively large data file from multiple multi-plane pages.

In some examples, a host system 305 may support an optimal transfer length for relatively large-sized file operations according to characteristics of the host system 305, the memory system 310, or a combination thereof. In some examples, the host system 305 may support a write optimal transfer length for relatively large-sized file operations of 512 kB or 1024 kB. The host system 305 may package user data for write operations using the optimal transfer length. Additionally, the host system 305, the memory system 310, or both may support metadata and small file operations of variable transfer lengths. For example, the host system 305 may write small files or metadata to a memory device 335, where a small file or metadata may have a transfer length that is dynamically determined according to the small file size or the metadata size. Additionally or alternatively, the memory system 310 may perform an internal write command for a small file or metadata. The transfer length for small files or metadata may be smaller than the optimal transfer length for relatively large-sized files. In some cases, the host system 305 may support a lower limit of a threshold size for reading and writing metadata and small files to the memory device 335 (e.g., 4 kB), which may correspond to the offset 345 size.

In some cases, die misalignment may occur in response to a memory system 310 mixing relatively large files with small files or metadata in a same multi-plane page. For example, the host system 305 may issue a batch of relatively large write commands 315. As an example, write commands 315 to precondition memory cells may be issued in relatively large batches (e.g., including multiple write commands 315 sent by the host system 305 in sequence, in parallel, or a combination thereof). In some cases, an internal write command for the memory system 310 (or another small file or metadata write command) may be interleaved within the batch of relatively large write commands 315. In some examples, such a process may occur due to multiple threads running in parallel at the host system 305, where one thread writes the relatively large files to the memory device 335 and another thread concurrently updates metadata, writes a small file to the memory device 335, or performs memory management operations (such as a garbage collection operation).

Mixing the data for the relatively large files with metadata, small file data, or both in the write buffer 325 may result in a die-misalignment configuration in the memory device 335 (e.g., in NAND flash). Due to the metadata or small file data, the data for a relatively large file may start at an offset 345 other than zero (e.g., starting at offset 10 and spanning the remaining units of the multi-plane page). Additionally or alternatively, the interleaved write command for small file data or metadata may fragment the data for the batch of relatively large write commands 315, reducing the quantity of sequential reads supported for reading the data from the batch of relatively large write commands 315. Accordingly, adding the first set of data 320-a to the write buffer 325 directly following a second set of data 320-b currently stored in the write buffer 325 may result in die misalignment for relatively large files if internal writes, metadata updates, small file creation, or some combination thereof are performed. Mixing the relatively large files with small files or metadata in a same multi-plane page may negatively affect the read performance for the relatively large file data.

The memory system 310 may improve a read performance of the memory device 335 if read commands are for sequential addresses (e.g., LBAs or physical block addresses). Accordingly, reading data from a memory device 335 starting from an offset of 0 (e.g., a boundary of a memory die) may support multiple sequential read operations (e.g., due to reading the data from multiple sequential addresses corresponding to the sequential offsets 345 of a multi-plane page of the memory die). To support such read performance benefits, the memory system 310 may perform write operations to mitigate memory die misalignment.

In some examples, during a write operation, the memory system 310 may determine whether a write command for a relatively large file (e.g., a "large chunk" write command) is occurring. For example, the memory system 310 may receive a write command 315 for a first set of data 320-a and may compare the first set of data 320-a to a size threshold. If the first set of data 320-a satisfies the size threshold (e.g., is greater than the size threshold, such as 64 kB or a multi-plane page size), the memory system 310 may determine that a relatively large chunk write command is occurring.

If the first set of data 320-a satisfies the size threshold, the memory system 310 may determine whether data (e.g., a second set of data 320-b) currently in the write buffer 325 aligns with a die boundary (e.g., an offset 345 of 0). For example, the write buffer 325 may write data to a memory device 335 at a location (e.g., an offset 345) indicated by an LBA cursor. The memory system 310 may determine whether writing the second set of data 320-b to the memory device 335 according to the LBA cursor results in updating the LBA cursor to point to an offset 345 of 0. In some examples, the second set of data 320-b in the write buffer 325 may result in memory die misalignment 350. For example, as illustrated, following the second set of data 320-b, the LBA cursor may point to an offset 345 of 10 (or another non-zero offset 345) within a multi-plane page of a memory die.

If the memory system 310 detects a memory die misalignment 350, the memory system 310 may pad the write buffer 325 with data (e.g., dummy data 330) such that writing the second set of data 320-b and the dummy data 330 to the memory device 335 according to the LBA cursor results in updating the LBA cursor to point to an offset 345 of 0 (e.g., for a subsequent multi-plane page). Accordingly, adding the dummy data 330 may support memory die alignment 355. Adding the first set of data 320-a to the write buffer 325 after padding the write buffer 325 with the dummy data 330 may increase the likelihood the relatively large file (e.g., satisfying the size threshold) is written to the same multi-plane page of a memory die and, correspondingly, that a sequential read operation is supported for reading the relatively large file data from the memory device 335.

Figure 4:
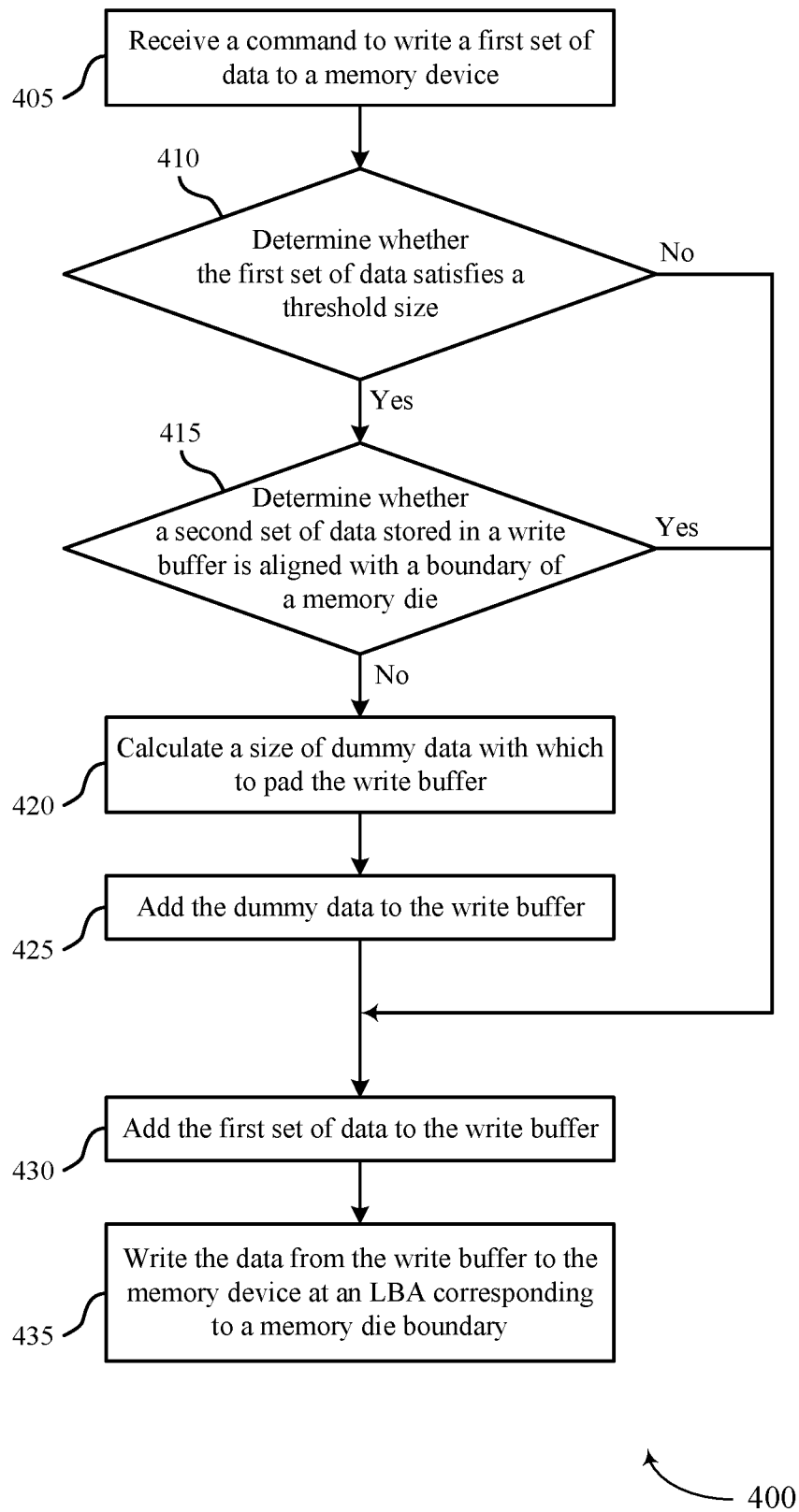
FIG. 4 illustrates an example of a process flow that supports techniques to mitigate memory die misalignment in accordance with examples as disclosed herein.

FIG. 4 illustrates an example of a process flow 400 that supports techniques to mitigate memory die misalignment in accordance with examples as disclosed herein. The process flow 400 may be performed by a memory system (or one or more components thereof), such as a memory system 110, a memory system 210, or a memory system 310 as described herein with reference to FIGS. 1 through 3. For example, the process flow 400 may be implemented by an apparatus (e.g., a memory system) including one or more memory devices and a controller coupled with the memory device(s). The memory system may implement the process flow 400 to mitigate memory die misalignment on write operations, effectively supporting improved read performance. In some cases, alternative examples of the following may be implemented, where some operations may be performed in a different order than described or are not performed at all. Additionally or alternatively, operations may include additional features not mentioned below, or further processes may be added.

At 405, a write command is received. The write command may be an example of an access command received from a host system and indicating for the memory system to write a first set of data to a memory device. The first set of data may correspond to a data transfer size. In some cases, the write command may be an example of a command from a batch of write commands.

At 410, it is determined (e.g., by the memory system) whether the first set of data satisfies a threshold size. For example, the memory system may store an indication of a threshold size (e.g., at a memory system controller, with a write buffer). The memory system may compare the size of the first set of data to the threshold size and may determine whether the first set of data equals or exceeds (e.g., satisfies) the threshold size or is less than (e.g., fails to satisfy) the threshold size. In some cases, the threshold size may be equal to a multi-plane page size of a memory die. If the first set of data satisfies the threshold size, the memory system may determine that the write command corresponds to a relatively large data file (e.g., a large chunk write command) and may perform a further determination at 415. If the first set of data fails to satisfy the threshold size, the memory system may add the first set of data to the write buffer (e.g., at 430).

At 415, it is determined (e.g., by the memory system) whether a second set of data stored in a write buffer is aligned with a boundary of a memory die. For example, if the first set of data is part of a relatively large chunk write command, the memory system may determine whether to perform data padding to mitigate memory die misalignment. The second set of data may be currently stored in the write buffer and, in some cases, may correspond to internal write data, small file data, or metadata interleaved with a batch of relatively large chunk write commands. In some examples, the memory system may determine whether a size of the second set of data stored in the write buffer is equal to a multiple of a multi-plane page size of the memory die. For example, if a cursor for the write buffer is currently die aligned, and the second set of data is a multiple of the multi-plane page size, writing the second set of data to the memory device may fill one or more multi-plane pages and update the cursor to still be die aligned. Accordingly, the memory system may determine that the second set of data (e.g., an end of the second set of data) is aligned with the boundary of the memory die. Additionally or alternatively, the memory system may determine whether a cursor of the write buffer indicates a first LBA of the memory die such that writing the second set of data to the memory die starting at the first LBA updates the cursor to indicate a second LBA corresponding to a boundary of the memory die (e.g., an offset of 0). If so, the memory system may determine that the second set of data (e.g., an end of the second set of data) stored in the write buffer is aligned with the boundary of the memory die.

If the second set of data currently in the write buffer is aligned with a boundary of the memory die, the memory system may add the first set of data to the write buffer (e.g., at 430). If the second set of data currently in the write buffer is misaligned with a boundary of the memory die, the memory system may add a third set of data (e.g., dummy data) to the write buffer to mitigate memory die misalignment (e.g., at 420 and 425).

At 420, a size of dummy data is calculated. For example, the memory system may determine a size of the third set of data to add to the write buffer. The memory system may determine the size according to a size of the second set of data currently stored in the write buffer, a boundary of the memory die, a current cursor position for the write buffer, or some combination thereof. For example, the calculated size of the dummy data may be such that writing the second set of data and the dummy data to the memory device starting at the current cursor position updates the cursor position to align with the boundary of the memory die. The dummy data may be an example of a set of data with a pre-configured value (e.g., zero bits, one bits), random or pseudo-random data, or data determined to indicate one or more aspects of other data (e.g., according to data in the write buffer, according to data in the write command). For example, the memory system may determine the dummy data as error control data or other data supporting a checking function for the first set of data, the second set of data, or both.

At 425, the dummy data is added to the write buffer. The memory system may add the dummy data (i.e., the third set of data) to the write buffer following the second set of data. At 430, the first set of data is added to the write buffer (i.e., after the dummy data is added). Due to the addition of the dummy data to the write buffer, the first set of data may be aligned with a boundary of the memory die.

At 435, the data is written from the write buffer to the memory device. For example, the memory system may write the second set of data, the third set of data (i.e., the dummy data), and the first set of data to the memory device according to a current cursor for the write buffer. The first set of data may be written to the memory die starting at an LBA corresponding to the boundary of the memory die (e.g., an offset of 0 for a multi-plane page due to the third set of data completing a previous multi-plane page). Accordingly, if the memory system receives a command (e.g., a second command) to read the first set of data from the memory device, the memory system may read the first set of data from the memory device using a sequential read operation due to the first set of data aligning with the boundary of the memory die (e.g., and being written to a same multi-plane page).

Aspects of the process flow 400 may be implemented by a controller in a system (such as a system 100, a system 200, or a system 300), among other components. Additionally or alternatively, aspects of the process flow 400 may be implemented as instructions stored in memory (e.g., firmware stored in a memory coupled with a memory system). For example, the instructions, when executed by a controller (e.g., a memory system controller), may cause the controller to perform the operations of the process flow 400.

Figure 5:
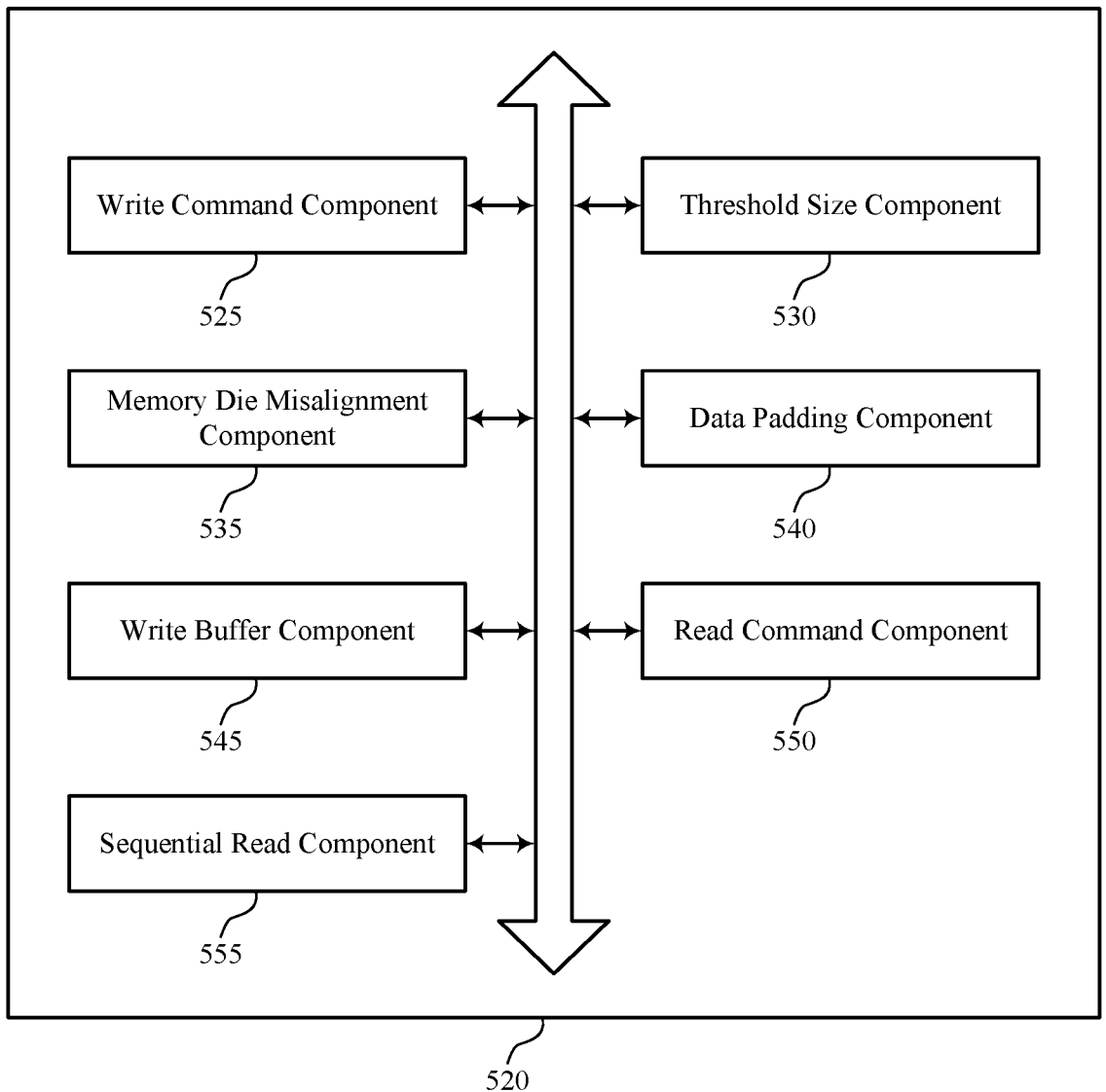
FIG. 5 shows a block diagram of a memory system that supports techniques to mitigate memory die misalignment in accordance with examples as disclosed herein.

FIG. 5 shows a block diagram 500 of a memory system 520 that supports techniques to mitigate memory die misalignment in accordance with examples as disclosed herein. The memory system 520 may be an example of aspects of a memory system as described with reference to FIGS. 1 through 4. The memory system 520, or various components thereof, may be an example of means for performing various aspects of techniques to mitigate memory die misalignment as described herein. For example, the memory system 520 may include a write command component 525, a threshold size component 530, a memory die misalignment component 535, a data padding component 540, a write buffer component 545, a read command component 550, a sequential read component 555, or any combination thereof. Each of these components may communicate, directly or indirectly, with one another (e.g., via one or more buses).

The write command component 525 may be configured as or otherwise support a means for receiving a command to write a first set of data to the memory system. The threshold size component 530 may be configured as or otherwise support a means for determining whether the first set of data satisfies a threshold size. The memory die misalignment component 535 may be configured as or otherwise support a means for determining whether a second set of data stored in a write buffer is aligned with a boundary of a memory die of the memory system based at least in part on (e.g., in response to) determining that the first set of data satisfies the threshold size. The data padding component 540 may be configured as or otherwise support a means for adding a third set of data to the write buffer based at least in part on (e.g., in response to) determining that the second set of data stored in the write buffer is misaligned with the boundary of the memory die. In some examples, the third set of data may include dummy data (e.g., for padding data in the write buffer).

In some examples, the write buffer component 545 may be configured as or otherwise support a means for adding the first set of data to the write buffer after adding the third set of data to the write buffer based at least in part on (e.g., in response to) determining that the second set of data stored in the write buffer is misaligned with the boundary of the memory die.

In some examples, the write buffer component 545 may be configured as or otherwise support a means for writing, from the write buffer and to the memory die, the first set of data in response to the command, where the first set of data is written to the memory die starting at an LBA corresponding to the boundary of the memory die based at least in part on (e.g., due to) adding the third set of data to the write buffer.

In some examples, the read command component 550 may be configured as or otherwise support a means for receiving a second command to read the first set of data from the memory system. In some examples, the sequential read component 555 may be configured as or otherwise support a means for reading, from the memory die and in response to the second command, the first set of data using a sequential read operation based at least in part on (e.g., in response to) the first set of data being written to the memory die starting at the LBA corresponding to the boundary of the memory die.

In some examples, to support determining whether the second set of data stored in the write buffer is aligned with the boundary of the memory die, the memory die misalignment component 535 may be configured as or otherwise support a means for determining whether a size of the second set of data stored in the write buffer is equal to a multiple of a multi-plane page size of the memory die.

In some examples, to support determining whether the second set of data stored in the write buffer is aligned with the boundary of the memory die, the memory die misalignment component 535 may be configured as or otherwise support a means for determining whether a cursor indicates a first LBA of the memory die such that writing the second set of data to the memory die starting at the first LBA updates the cursor to indicate a second LBA corresponding to the boundary of the memory die.

In some examples, the data padding component 540 may be configured as or otherwise support a means for determining a size of the third set of data to add to the write buffer based at least in part on (e.g., calculated using) a size of the second set of data stored in the write buffer and the boundary of the memory die, where the third set of data is added to the write buffer according to the determined size of the third set of data.

In some examples, the write command component 525 may be configured as or otherwise support a means for receiving at least a first command of a batch of commands to write a fourth set of data to the memory device, where the command to write the first set of data includes a second command of the batch of commands. In some examples, the write command component 525 may be configured as or otherwise support a means for receiving, after receiving at least the first command of the batch of commands and before receiving the second command of the batch of commands, a third command to write the second set of data to the memory device, where the second set of data fails to satisfy the threshold size. In some examples, the write buffer component 545 may be configured as or otherwise support a means for adding the second set of data to the write buffer after adding the fourth set of data to the write buffer and before adding the first set of data to the write buffer, where determining that the second set of data stored in the write buffer is misaligned with the boundary of the memory die is based at least in part on (e.g., in response to) the second set of data failing to satisfy the threshold size.

In some examples, the threshold size includes a multi-plane page size of the memory die. In some examples, the memory die includes a plurality of multi-plane pages, each multi-plane page of the plurality of multi-plane pages including a plurality of offsets at which data can be written. In some examples, data (e.g., first data) written to the memory die starting at a multi-plane page offset of zero is aligned with the boundary of the memory die and data (e.g., second data) written to the memory die starting at a non-zero multi-plane page offset is misaligned with the boundary of the memory die.

Figure 6:
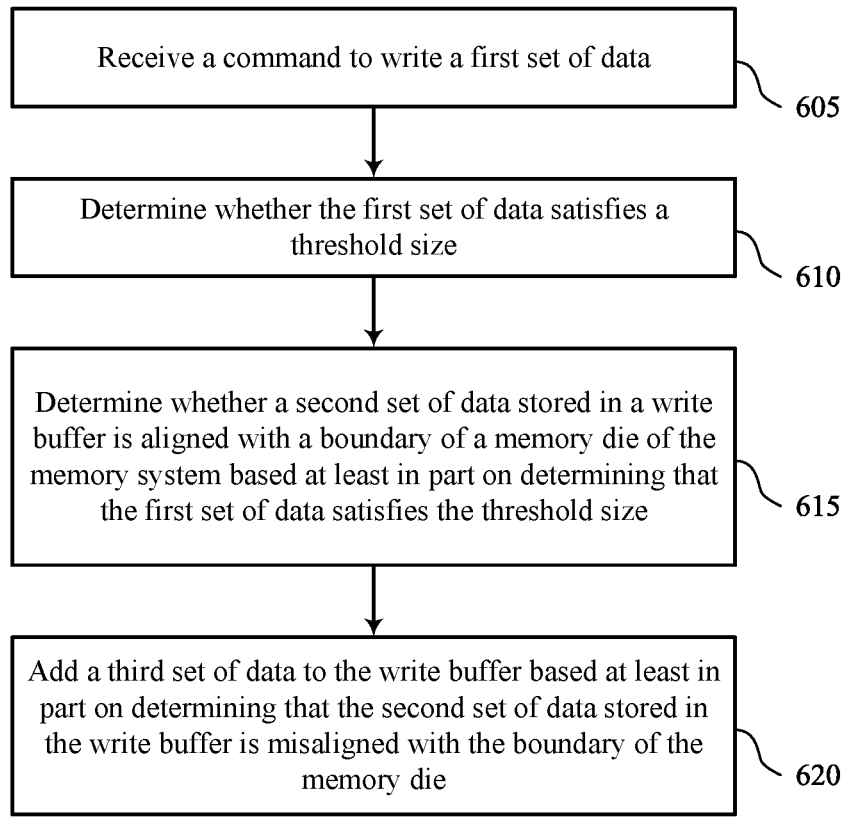
FIG. 6 shows a flowchart illustrating a method or methods that support techniques to mitigate memory die misalignment in accordance with examples as disclosed herein.

FIG. 6 shows a flowchart illustrating a method 600 that supports techniques to mitigate memory die misalignment in accordance with examples as disclosed herein. The operations of method 600 may be implemented by a memory system or its components as described herein. For example, the operations of method 600 may be performed by a memory system as described with reference to FIGS. 1 through 5. In some examples, a memory system may execute a set of instructions to control the functional elements of the device to perform the described functions. Additionally or alternatively, the memory system may perform aspects of the described functions using special-purpose hardware.

At 605, the method may include receiving a command to write a first set of data to the memory system. The operations of 605 may be performed in accordance with examples as disclosed herein. In some examples, aspects of the operations of 605 may be performed by a write command component 525 as described with reference to FIG. 5.

At 610, the method may include determining whether the first set of data satisfies a threshold size. The operations of 610 may be performed in accordance with examples as disclosed herein. In some examples, aspects of the operations of 610 may be performed by a threshold size component 530 as described with reference to FIG. 5.

At 615, the method may include determining whether a second set of data stored in a write buffer is aligned with a boundary of a memory die of the memory system based at least in part on determining that the first set of data satisfies the threshold size. The operations of 615 may be performed in accordance with examples as disclosed herein. In some examples, aspects of the operations of 615 may be performed by a memory die misalignment component 535 as described with reference to FIG. 5.

At 620, the method may include adding a third set of data to the write buffer based at least in part on determining that the second set of data stored in the write buffer is misaligned with the boundary of the memory die. The operations of 620 may be performed in accordance with examples as disclosed herein. In some examples, aspects of the operations of 620 may be performed by a data padding component 540 as described with reference to FIG. 5.

In some examples, an apparatus as described herein may perform a method or methods, such as the method 600. The apparatus may include, features, circuitry, logic, means, or instructions (e.g., a non-transitory computer-readable medium storing instructions executable by a processor) for receiving a command to write a first set of data to a memory system, determining whether the first set of data satisfies a threshold size, determining whether a second set of data stored in a write buffer is aligned with a boundary of a memory die of the memory system based at least in part on determining that the first set of data satisfies the threshold size, and adding a third set of data to the write buffer based at least in part on determining that the second set of data stored in the write buffer is misaligned with the boundary of the memory die.

Some examples of the method 600 and the apparatus described herein may further include operations, features, circuitry, logic, means, or instructions for adding the first set of data to the write buffer after adding the third set of data to the write buffer based at least in part on determining that the second set of data stored in the write buffer may be misaligned with the boundary of the memory die.

Some examples of the method 600 and the apparatus described herein may further include operations, features, circuitry, logic, means, or instructions for writing, from the write buffer and to the memory die, the first set of data in response to the command, where the first set of data may be written to the memory die starting at an LBA corresponding to the boundary of the memory die based at least in part on adding the third set of data to the write buffer.

Some examples of the method 600 and the apparatus described herein may further include operations, features, circuitry, logic, means, or instructions for receiving a second command to read the first set of data from the memory system and reading, from the memory die and in response to the second command, the first set of data using a sequential read operation based at least in part on the first set of data being written to the memory die starting at the LBA corresponding to the boundary of the memory die.

In some examples of the method 600 and the apparatus described herein, determining whether the second set of data stored in the write buffer is aligned with the boundary of the memory die may include operations, features, circuitry, logic, means, or instructions for determining whether a size of the second set of data stored in the write buffer is equal to a multiple of a multi-plane page size of the memory die.

In some examples of the method 600 and the apparatus described herein, determining whether the second set of data stored in the write buffer is aligned with the boundary of the memory die may include operations, features, circuitry, logic, means, or instructions for determining whether a cursor indicates a first LBA of the memory die such that writing the second set of data to the memory die starting at the first LBA updates the cursor to indicate a second LBA corresponding to the boundary of the memory die.

Some examples of the method 600 and the apparatus described herein may further include operations, features, circuitry, logic, means, or instructions for determining a size of the third set of data to add to the write buffer based at least in part on a size of the second set of data stored in the write buffer and the boundary of the memory die, where the third set of data may be added to the write buffer according to the determined size of the third set of data.

Some examples of the method 600 and the apparatus described herein may further include operations, features, circuitry, logic, means, or instructions for receiving at least a first command of a batch of commands to write a fourth set of data to the memory device, where the command to write the first set of data includes a second command of the batch of commands, receiving, after receiving at least the first command of the batch of commands and before receiving the second command of the batch of commands, a third command to write the second set of data to the memory device, where the second set of data fails to satisfy the threshold size, and adding the second set of data to the write buffer after adding the fourth set of data to the write buffer and before adding the first set of data to the write buffer, where determining that the second set of data stored in the write buffer is misaligned with the boundary of the memory die may be based at least in part on the second set of data failing to satisfy the threshold size.

In some examples of the method 600 and the apparatus described herein, the third set of data includes dummy data.

In some examples of the method 600 and the apparatus described herein, the threshold size includes a multi-plane page size of the memory die.

In some examples of the method 600 and the apparatus described herein, the memory die includes a plurality of multi-plane pages, each multi-plane page of the plurality of multi-plane pages including a plurality of offsets at which data can be written, first data written to the memory die starting at a multi-plane page offset of zero may be aligned with the boundary of the memory die, and second data written to the memory die starting at a non-zero multi-plane page offset may be misaligned with the boundary of the memory die.

It should be noted that the methods described above describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit according to the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or technologies such as infrared, radio, and microwave, then the coaxial cable, fiber optic cable, twisted pair, DSL, or technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
a memory device; and
a controller coupled with the memory device and configured to cause the apparatus to:
receive a command to write a first set of data;
determine whether the first set of data satisfies a threshold size;
determine whether a second set of data stored in a write buffer is aligned with a boundary of a memory die of the memory device based at least in part on determining that the first set of data satisfies the threshold size; and
add a third set of data to the write buffer based at least in part on determining that the second set of data stored in the write buffer is misaligned with the boundary of the memory die.

2. The apparatus of claim 1, wherein the controller is further configured to cause the apparatus to:
add the first set of data to the write buffer after adding the third set of data to the write buffer based at least in part on determining that the second set of data stored in the write buffer is misaligned with the boundary of the memory die.

3. The apparatus of claim 2, wherein the controller is further configured to cause the apparatus to:
write, from the write buffer and to the memory die, the first set of data in response to the command, wherein the first set of data is written to the memory die starting at a logical block address corresponding to the boundary of the memory die based at least in part on adding the third set of data to the write buffer.

4. The apparatus of claim 3, wherein the controller is further configured to cause the apparatus to:
receive a second command to read the first set of data from the memory device; and
read, from the memory die and in response to the second command, the first set of data using a sequential read operation based at least in part on the first set of data being written to the memory die starting at the logical block address corresponding to the boundary of the memory die.

5. The apparatus of claim 1, wherein the controller configured to cause the apparatus to determine whether the second set of data stored in the write buffer is aligned with the boundary of the memory die is configured to cause the apparatus to:
determine whether a size of the second set of data stored in the write buffer is equal to a multiple of a multi-plane page size of the memory die.

6. The apparatus of claim 1, wherein the controller configured to cause the apparatus to determine whether the second set of data stored in the write buffer is aligned with the boundary of the memory die is configured to cause the apparatus to:
determine whether a cursor indicates a first logical block address of the memory die such that writing the second set of data to the memory die starting at the first logical block address updates the cursor to indicate a second logical block address corresponding to the boundary of the memory die.

7. The apparatus of claim 1, wherein the controller is further configured to cause the apparatus to:
determine a size of the third set of data to add to the write buffer based at least in part on a size of the second set of data stored in the write buffer and the boundary of the memory die, wherein the third set of data is added to the write buffer according to the determined size of the third set of data.

8. The apparatus of claim 1, wherein the controller is further configured to cause the apparatus to:
receive at least a first command of a batch of commands to write a fourth set of data to the memory device, wherein the command to write the first set of data comprises a second command of the batch of commands;
receive, after receiving at least the first command of the batch of commands and before receiving the second command of the batch of commands, a third command to write the second set of data to the memory device, wherein the second set of data fails to satisfy the threshold size; and
add the second set of data to the write buffer after adding the fourth set of data to the write buffer and before adding the first set of data to the write buffer, wherein determining that the second set of data stored in the write buffer is misaligned with the boundary of the memory die is based at least in part on the second set of data failing to satisfy the threshold size.

9. The apparatus of claim 1, wherein the third set of data comprises dummy data.

10. The apparatus of claim 1, wherein the threshold size comprises a multi-plane page size of the memory die.

11. The apparatus of claim 1, wherein:
the memory die comprises a plurality of multi-plane pages, each multi-plane page of the plurality of multi-plane pages comprising a plurality of offsets at which data can be written;
first data written to the memory die starting at a multi-plane page offset of zero is aligned with the boundary of the memory die; and second data written to the memory die starting at a non-zero multi-plane page offset is misaligned with the boundary of the memory die.

12. A non-transitory computer-readable medium storing code comprising instructions which, when executed by a processor of an electronic device, cause the electronic device to:
    receive a command to write a first set of data to a memory system;
    determine whether the first set of data satisfies a threshold size;
    determine whether a second set of data stored in a write buffer is aligned with a boundary of a memory die of the memory system based at least in part on determining that the first set of data satisfies the threshold size; and
    add a third set of data to the write buffer based at least in part on determining that the second set of data stored in the write buffer is misaligned with the boundary of the memory die.

13. The non-transitory computer-readable medium of claim 12, wherein the instructions, when executed by the processor of the electronic device, further cause the electronic device to:
    add the first set of data to the write buffer after adding the third set of data to the write buffer based at least in part on determining that the second set of data stored in the write buffer is misaligned with the boundary of the memory die.

14. The non-transitory computer-readable medium of claim 13, wherein the instructions, when executed by the processor of the electronic device, further cause the electronic device to:
    write, from the write buffer and to the memory die, the first set of data in response to the command, wherein the first set of data is written to the memory die starting at a logical block address corresponding to the boundary of the memory die based at least in part on adding the third set of data to the write buffer.

15. The non-transitory computer-readable medium of claim 14, wherein the instructions, when executed by the processor of the electronic device, further cause the electronic device to:
    receive a second command to read the first set of data from the memory system; and
    read, from the memory die and in response to the second command, the first set of data using a sequential read operation based at least in part on the first set of data being written to the memory die starting at the logical block address corresponding to the boundary of the memory die.

16. The non-transitory computer-readable medium of claim 12, wherein the instructions that, when executed by the processor of the electronic device, cause the electronic device to determine whether the second set of data stored in the write buffer is aligned with the boundary of the memory die further cause the electronic device to:
    determine whether a size of the second set of data stored in the write buffer is equal to a multiple of a multi-plane page size of the memory die.

17. The non-transitory computer-readable medium of claim 12, wherein the instructions that, when executed by the processor of the electronic device, cause the electronic device to determine whether the second set of data stored in the write buffer is aligned with the boundary of the memory die further cause the electronic device to:
    determine whether a cursor indicates a first logical block address of the memory die such that writing the second set of data to the memory die starting at the first logical block address updates the cursor to indicate a second logical block address corresponding to the boundary of the memory die.

18. The non-transitory computer-readable medium of claim 12, wherein the instructions, when executed by the processor of the electronic device, further cause the electronic device to:
    determine a size of the third set of data to add to the write buffer based at least in part on a size of the second set of data stored in the write buffer and the boundary of the memory die, wherein the third set of data is added to the write buffer according to the determined size of the third set of data.

19. The non-transitory computer-readable medium of claim 12, wherein the instructions, when executed by the processor of the electronic device, further cause the electronic device to:
    receive at least a first command of a batch of commands to write a fourth set of data to the memory system, wherein the command to write the first set of data to the memory system comprises a second command of the batch of commands;
    receive, after receiving at least the first command of the batch of commands and before receiving the second command of the batch of commands, a third command to write the second set of data to the memory system, wherein the second set of data fails to satisfy the threshold size; and
    add the second set of data to the write buffer after adding the fourth set of data to the write buffer and before adding the first set of data to the write buffer, wherein determining that the second set of data stored in the write buffer is misaligned with the boundary of the memory die is based at least in part on the second set of data failing to satisfy the threshold size.

20. The non-transitory computer-readable medium of claim 12, wherein the third set of data comprises dummy data.

21. A method performed by a memory system, the method comprising:
    receiving a command to write a first set of data to the memory system;
    determining whether the first set of data satisfies a threshold size;
    determining whether a second set of data stored in a write buffer is aligned with a boundary of a memory die of the memory system based at least in part on determining that the first set of data satisfies the threshold size; and
    adding a third set of data to the write buffer based at least in part on determining that the second set of data stored in the write buffer is misaligned with the boundary of the memory die.

22. The method of claim 21, further comprising:
    adding the first set of data to the write buffer after adding the third set of data to the write buffer based at least in part on determining that the second set of data stored in the write buffer is misaligned with the boundary of the memory die.

23. The method of claim 22, further comprising:
    writing, from the write buffer and to the memory die, the first set of data in response to the command, wherein the first set of data is written to the memory die starting at a logical block address corresponding to the boundary of the memory die based at least in part on adding the third set of data to the write buffer.

24. The method of claim 23, further comprising:

receiving a second command to read the first set of data from the memory system; and reading, from the memory die and in response to the second command, the first set of data using a sequential read operation based at least in part on the first set of data being written to the memory die starting at the logical block address corresponding to the boundary of the memory die.

\* \* \* \* \*